United States Patent [19]

Robertson, Jr. et al.

[11] Patent Number: 5,392,193
[45] Date of Patent: Feb. 21, 1995

[54] TRANSISTOR MOUNTING DEVICE

[75] Inventors: William H. Robertson, Jr., Plantation; Chot Q. Pham, Coral Springs; Philip C. Warder, Plantation; James L. Stephens, Sunrise, all of Fla.

[73] Assignee: Motorola, Inc., Schaumburg, Ill.

[21] Appl. No.: 251,445

[22] Filed: May 31, 1994

[51] Int. Cl.⁶ .............................................. H05K 7/20
[52] U.S. Cl. .................. 361/704; 165/80.2; 165/80.3; 165/185; 174/16.3; 257/712; 361/710; 361/761; 361/767; 361/773; 361/776; 361/808; 361/809
[58] Field of Search ............ 165/80.2, 80.3, 185; 174/16.3, 51 R; 257/707, 712, 718–719, 726–727, 731–732, 768, 699; 361/704, 707–723, 760, 767, 773–774, 776, 783, 799, 800, 807–812, 820–821, 825, 815, 836

[56] References Cited

U.S. PATENT DOCUMENTS

| 3,146,384 | 8/1964 | Ruehle | 165/80.3 |
| 3,262,028 | 7/1966 | Hermann | 165/80.3 |
| 4,190,879 | 2/1980 | Tissot | 361/704 |
| 4,701,828 | 10/1987 | Weiner | 361/710 |
| 5,166,862 | 11/1992 | Durivage, III et al. | 361/720 |

*Primary Examiner*—Gregory D. Thompson
*Attorney, Agent, or Firm*—Pedro P. Hernandez

[57] ABSTRACT

A transistor mounting device (102) includes a recess area (112) for allowing a transistor (114) to be secured to the transistor mounting device (102) by turning the transistor a certain amount. Once the transistor (114) is secured into position to the transistor mounting device (102), a set of transistor pads (402) provide support and alignment to the transistor fins (116).

15 Claims, 3 Drawing Sheets

TRANSISTOR MOUNTING DEVICE

TECHNICAL FIELD

This invention relates generally to transistor mounting devices and more specifically to a transistor mounting device for use with power transistors.

BACKGROUND

When mounting radio frequency power transistors onto printed circuit boards, ground straps are typically required to be soldered between the flange or heat sink section of the power transistor which are typically designed to be grounded and the chassis of the radio in order to provide adequate grounding of the transistor device. Usually two such ground straps are required per power transistor, with each transistor requiring two hand soldering operations to be performed in order to solder the grounding strap between the transistor flange and the radio chassis.

Another problem encountered with prior art power transistor mounting techniques is that it is difficult to solder reflow the transistor leads on the same side of the printed circuit board as the matching elements which are coupled to the transistor. Without proper lead mounting, parasitic lead inductances are increased, causing for higher Q matches which result in the decrease of the transistor's bandwidth.

A need thus exists for a transistor mounting device which can alleviate the above mentioned problems as well as provide for improved heat-sinking of the power transistor.

DETAILED DESCRIPTION OF THE PREFERRED EMBODIMENT

Figure 1:
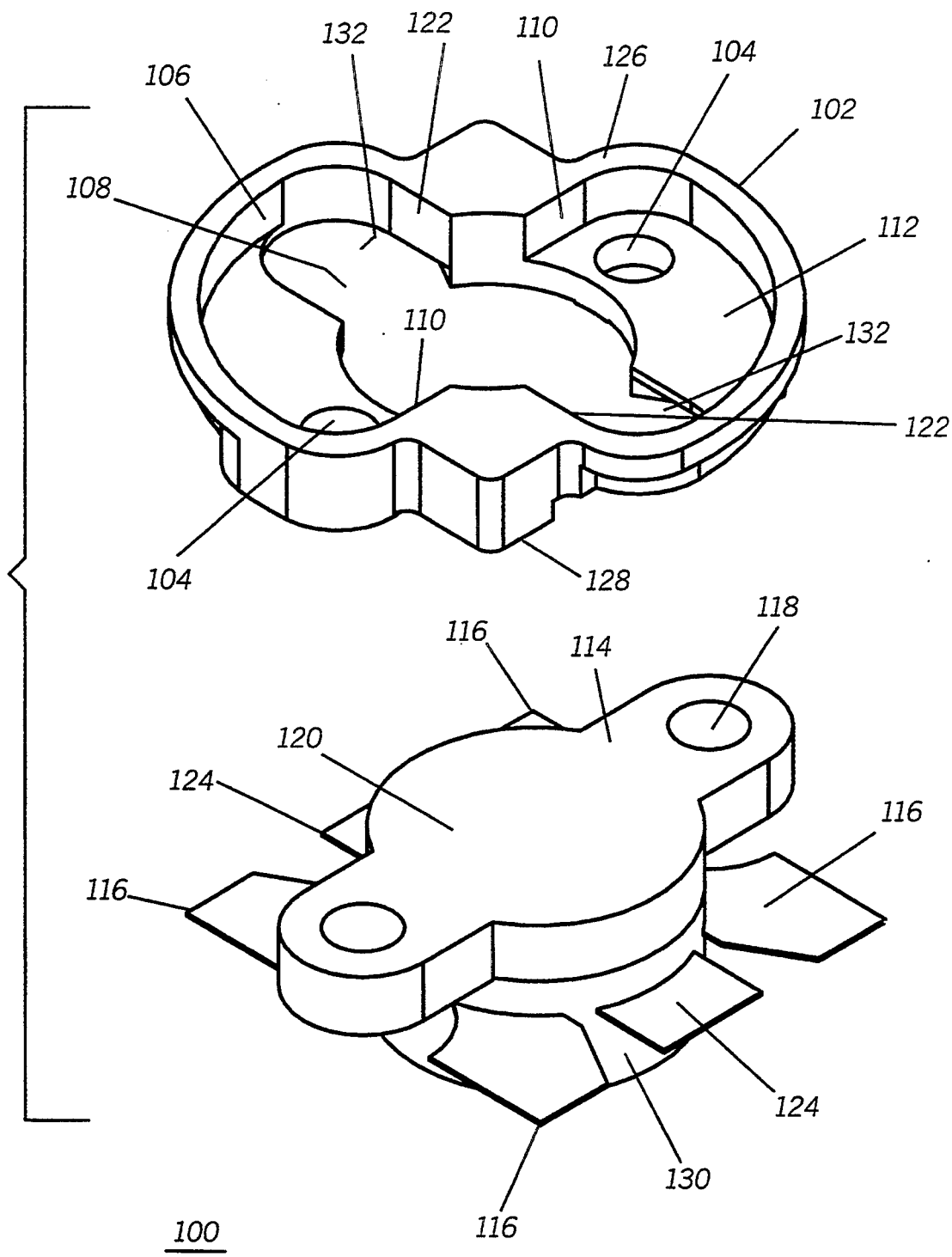
FIG. 1 shows an exploded view of a transistor assembly in accordance with the present invention.

Referring to FIG. 1, an exploded view of a transistor assembly 100 which includes a transistor mounting device 102 and transistor 114 in accordance with the present invention is shown. The transistor mounting device 102 is preferably formed from a metal or metal alloy which can provide both electrical conductivity and heat dissipation. In the preferred embodiment, the transistor mounting device 102 is formed from a zinc alloy which is then tin platted, although many different types of metals and metal alloys can also be used as known in the art.

The transistor mounting device 102 includes a set of through holes or apertures 104 used to allow fasteners (not shown), such as screws, to mount the mounting device 102 to a substrate (e.g., printed circuit board, etc.). A set of matching through holes 118 can be found on power transistor 114. The mounting device 102 further includes a larger keyed aperture 108 having the outline of a flange or heat sink portion 120 which is part of power transistor 114. Keyed aperture 108 has a defined shape which allows for the heat sink portion (flange) 120 of transistor 120 to pass through aperture 108. Aperture 108 cuts through the first 126 and second 128 opposed sides of transistor mounting device 102. Keyed aperture 108 includes a set of extended aperture members 132 which allow for the long ends (ends having apertures 118) of heat sink portion 120 to pass through.

A recess means for securably receiving the heat sink portion 120 of transistor 114 is formed preferably by recess area 112. Recess area 112 includes a wall 106 defining the shape of the recess area and is located on the first side 126 of the mounting device 102. The recess area 112 allows for the heat sink portion or flange 120 of transistor 114 to travel within the recess area a predetermined amount when the transistor is turned in a given direction. A set of raised wall members 122 located at the edge or lip of the keyed aperture 108 prevent transistor 114 from turning in a first direction when the heat sink portion 120 is first inserted into the recess area 112. A set of second wall members or transistor stops 110 prevent the transistor from turning any further once the transistor has been turned approximately a half turn in a second direction (in this case counterclockwise). Once the walls of heat sink portion 120 make contact with second wall members 110, the transistor 114 is secured in place to the mounting device 102. Apertures 118 and 104 also become aligned once the heat sink wall's make contact with second wall members 110, thereby allowing for a fastener such as a screw as mentioned before to run through both the transistor 114 and transistor mounting device 102.

Transistor 114 includes a first set of fins 116 which in the preferred embodiment are the emitter terminals of transistor 114. A second set of control terminals or fins 124 also extend from the ceramic portion 130 of transistor 114. One of the control terminals 124 is the base terminal of transistor 114, while the other control terminal 124 is the collector terminal of transistor 114. In the preferred embodiment, once transistor 114 is secured to transistor mounting device 102, the emitter terminals 116 make electrical contact with the body of transistor mounting device 102, while the control terminals are electrically isolated from the body of transistor mounting device 102. Control terminals 124 rest above the extended aperture members 132 of keyed aperture 108 when transistor 114 is secured to mounting device 102 (i.e., when transistor 114 is turned approximately one half turn thereby captivating the transistor 114).

Figure 2:
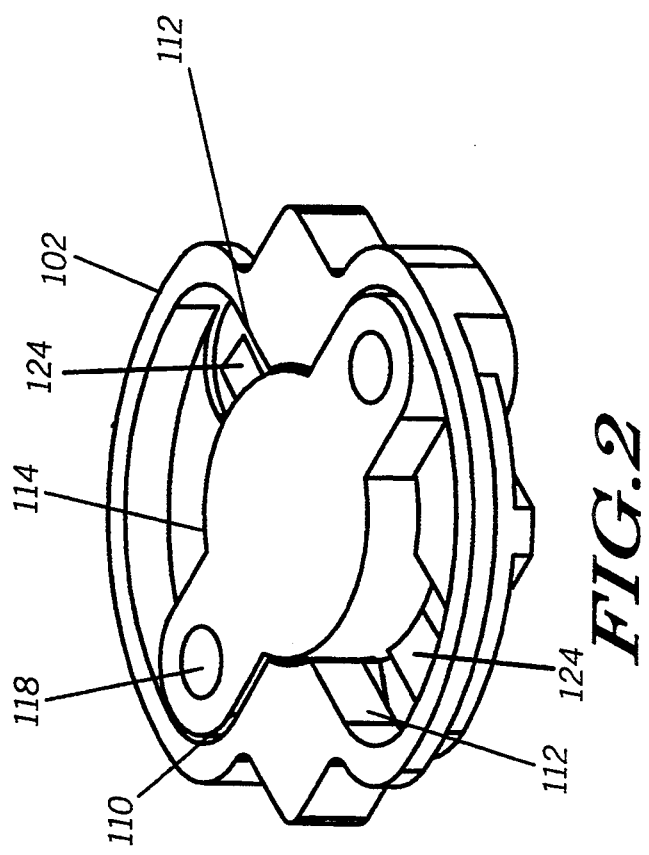
FIG. 2 shows a power transistor mounted onto the transistor mounting device in accordance with the invention.

Referring now to FIG. 2, transistor 114 is shown coupled to the transistor mounting device 102 in the secured position. Transistor 114 can be removed from the mounting device 102 by turning the transistor 114 approximately a half turn in the direction of first wall members 112.

Figure 4:
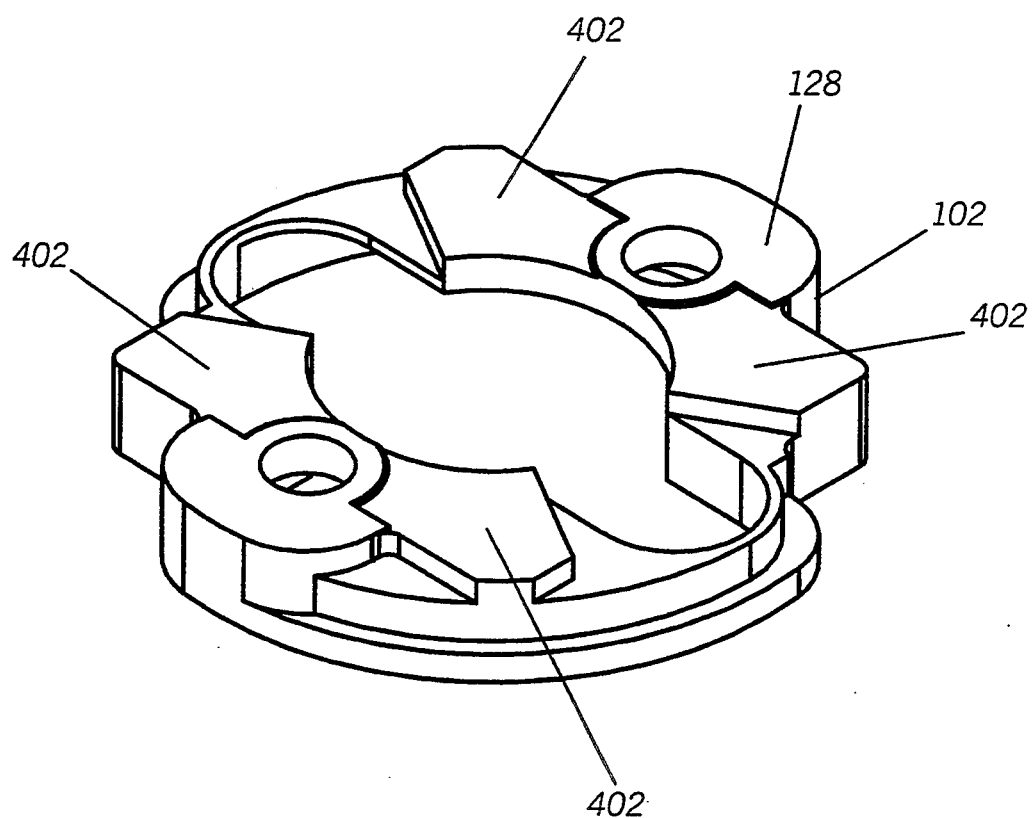
FIG. 4 shows the other side of the transistor mounting device shown in FIG. 1.

Referring to FIG. 4, the second side 128 of transistor mounting device 102 is shown. The second side 128 includes a set of substantially flat mounting pads 402. When the transistor 114 is secured to the transistor mounting device 102 by turning the transistor approximately one half turn, the set of four transistor fins (emitter terminals in this example) 116 lie directly on top of corresponding pads 402. These pads 402 provide protection for the transistor fins 116 and also allows for them to be reflow soldered to a printed circuit board (see FIG. 4). Pads 402 provide back support to the fins 116 and allow for them to be pressed against the circuit board surface once the mounting device is fastened to the circuit board. In the preferred embodiment, transistor fins 116 are spot welded to pads 402 in order to provide for good electrical and mechanical contact between the fins and pads. The two transistor control terminals 122 lie over the long ends of aperture 108 and therefore do not become electrically shorted to the transistor mounting device 102 which is preferably at ground potential once installed to circuit board 302. In this particular case, emitter terminals 116 would be coupled to ground forming a grounded emitter transistor configuration.

Figure 3:
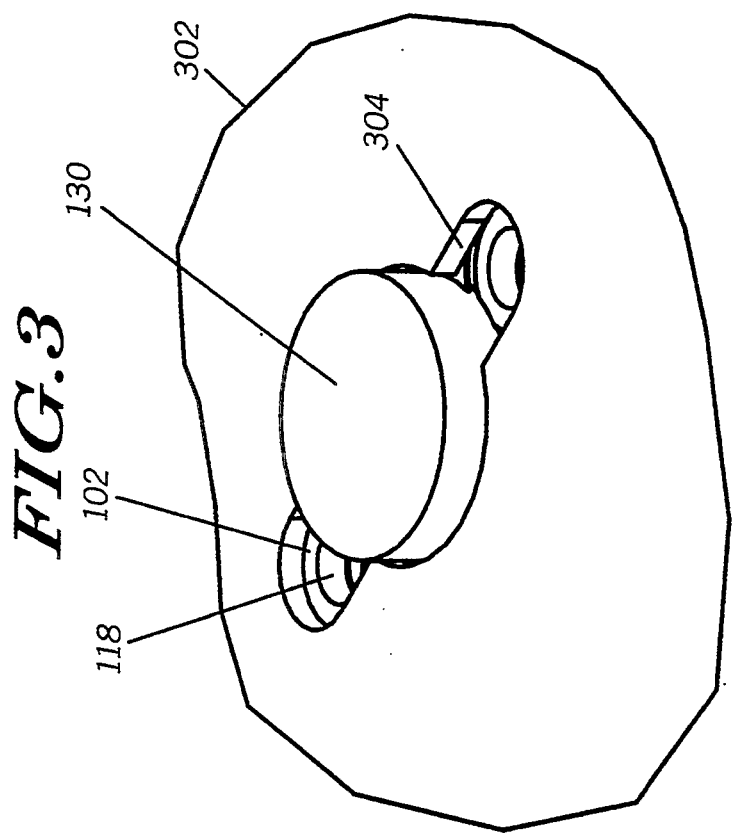
FIG. 3 shows the transistor and mounting device attached to a portion of a printed circuit board.

In FIG. 3, the transistor 114 is shown coupled to the transistor mounting device 102. The transistor assembly is shown placed on to a printed circuit board 302 before fasteners such as screws are used to secure the transistor assembly to the circuit board 302. An aperture 304 on the printed circuit board 302 allows for the ceramic top portion 130 of the transistor 114 to pass through the circuit board. The circuit board aperture 304 also allows for the apertures 104 found on the transistor mounting device 102 to be exposed. This allows for a set of fasteners to be passed through both the apertures 104 on the transistor mounting device 102 and the printed circuit board 302 in order for the power transistor assembly 100 to be mechanically fastened to the circuit board 302. Once coupled to the circuit board 302, the transistor assembly can be reflow soldered, allowing for transistor fins 116 and 124 to become soldered to corresponding solder pads (not shown) located on the bottom surface of circuit board 302. The transistor mounting device 102 provides for both support and alignment of the transistor fins 116, 124 against the surface of circuit board 302.

Although the present invention has been shown with the emitter terminals 116 of transistor grounded, other transistor configurations can be easily designed for by those skilled in the art by modifying the design of transistor mounting device 102.

Transistor mounting device 102 provides for improvement in the alignment of the transistor fins 116 and 124 to circuit board 302, and allows for the fins 116, 124 to be easily solder reflowed onto the printed circuit board 302. The mounting device 302 helping to maintain the fins 116, 124 substantially flat against the circuit board 302. In radio frequency applications, the transistor mounting device allows for the solder reflowing of the transistor fins 116, 124 on the same side as the transistor matching elements. This helps reduce parasitic lead inductances which allows for lower Q matches and thus provides for larger power amplifier bandwidths. Secondly, the transistor mounting device 102 allows for improved grounding of the power transistor without the use of grounding straps as required in prior art applications. Thirdly, the mounting device enables the automated placement and soldering of the power transistor assembly, thus eliminating many of the manufacturing defects attributed to the manual placement and soldering of prior art power transistors. Finally, the mounting device 102 acts as a secondary heat sink for the transistor which is mounted to the mounting device 102 and also provides for improved heat transfer for the printed circuit board ground runners at the immediate area of the device flange.

What is claimed is:

1. A transistor mounting device, comprising:
   first and second opposed sides;
   a keyed aperture having a defined shape located through the first and second opposed sides;
   at least one wall member located on the first side of the transistor mounting device, the wall member located at the edge of the keyed aperture;
   at least one mounting pad located on the second side; and the keyed aperture has a set of extended aperture members and the at least one wall member is located at the edge of at least one of the extended aperture members.

2. A transistor mounting device as defined in claim 1, wherein the transistor mounting device is formed from metal.

3. A transistor mounting device as defined in claim 1, further comprising a recess area located on the first side and at least one aperture formed on the recess area through the first and second sides.

4. A transistor mounting assembly, comprising:
   a transistor including a heat sink having a defined shape and a plurality of transistor terminals;
   a transistor mounting device for receiving the transistor, comprising:
   first and second opposed sides;
   a keyed aperture having a defined shape located through the first and second opposed sides for receiving the transistor heat sink from the second side;
   a recess area located on the first side;
   a first wall member located on the first side of the transistor mounting device, the first wall member located at an edge of the keyed aperture for preventing the heat sink to be turned in a first direction once it has been inserted through the keyed aperture; and
   a second wall member located on the first side of the transistor mounting device, the second wall member allowing the transistor heat sink to travel a predetermined amount in a second direction before the heat sink contacts the second wall member.

5. A transistor mounting assembly as defined in claim 4, wherein the transistor becomes secured to the transistor mounting device when the transistor is turned the predetermined amount in the second direction.

6. A transistor mounting assembly as defined in claim 5, further comprising:
   a set of mounting pads located on the second side of the transistor mounting device;
   and at least some of the plurality of transistor terminals rest on top of the mounting pads when the transistor becomes secured to the transistor mounting device.

7. A transistor mounting assembly as defined in claim 5, further comprising:
   at the transistor:
      at least one aperture located through the transistor heat sink;
   at the transistor mounting device:
      at least one aperture formed on the recess area and through the first and second sides of the transistor mounting device; and
   wherein the at least one aperture on the transistor heat sink and the at least one aperture on the transistor mounting device are aligned when the transistor becomes secured to the transistor mounting device.

8. A transistor mounting device as defined in claim 7, wherein at least one of the plurality of transistor terminals does not make electrical contact with the transistor mounting device when the transistor is secured to the transistor mounting device.

9. An electronic assembly, comprising:
a transistor including a heat sink portion and a plurality of transistor terminals; and
a transistor mounting device for securably mounting the transistor, comprising:
first and second opposed sides;
a keyed aperture for receiving the transistor heat sink, the keyed aperture extending through the first and second sides;
a plurality of mounting pads located on the second side of the transistor mounting device; and
a recess means located on the first side for allowing the transistor to be turned a predetermined amount and become secured to the transistor mounting device when the heat sink portion is inserted into the keyed aperture from the second side of the transistor mounting device.

10. An electronic assembly as defined in claim 9, wherein the recess means allows the transistor to be turned in only one direction and for a predetermined amount once the transistor heat sink portion is inserted into the keyed aperture.

11. An electronic assembly as defined in claim 10, wherein the some of the plurality of transistor terminals become aligned with the plurality of mounting pads on the transistor mounting device when the transistor is secured to the transistor mounting device.

12. An electronic assembly as defined in claim 10, wherein the transistor heat sink portion includes a set of extended members and the recess means includes a wall member located on the transistor mounting device which allows the extended members to travel in only one direction.

13. An electronic assembly as defined in claim 9, further comprising:
a printed circuit board having a plurality of solder pads;
the transistor securably mounted to the transistor mounting device is attached to the printed circuit board causing some of the transistor terminals to become aligned with the plurality of solder pads located on the printed circuit board.

14. An electronic assembly as defined in claim 13, wherein some of the transistor terminals are reflow soldered to the solder pads located on the printed circuit board.

15. An electronic assembly as defined in claim 13, wherein the circuit board includes an aperture; and
a portion of the transistor extends through the aperture located on the printed circuit board when the transistor is attached to the circuit board.

* * * * *